(12) United States Patent
Licausi et al.

(10) Patent No.: US 10,366,919 B2
(45) Date of Patent: Jul. 30, 2019

(54) FULLY ALIGNED VIA IN GROUND RULE REGION

(71) Applicant: GLOBALFOUNDRIES INC., Grand Cayman (KY)

(72) Inventors: Nicholas V. Licausi, Watervliet, NY (US); Xunyuan Zhang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/709,956

(22) Filed: Sep. 20, 2017

(65) Prior Publication Data

US 2019/0088541 A1   Mar. 21, 2019

(51) Int. Cl.
    *H01L 21/768*  (2006.01)
    *H01L 23/528*  (2006.01)
    (Continued)

(52) U.S. Cl.
    CPC .. *H01L 21/76883* (2013.01); *H01L 21/76843* (2013.01); *H01L 23/5283* (2013.01);
    (Continued)

(58) Field of Classification Search
    None
    See application file for complete search history.

(56) References Cited

U.S. PATENT DOCUMENTS 9,741,609 B1    8/2017  Cheng et al.
2006/0251800 A1* 11/2006 Weidman ............... B82Y 30/00
                                                      427/99.5
(Continued)

FOREIGN PATENT DOCUMENTS

DE    102017203568    9/2017
JP       2014179636    9/2014
(Continued)

OTHER PUBLICATIONS

German Office Action in related DE Application No. 10 2018 200 438.2 dated May 17, 2018, 7 pages.

*Primary Examiner* — Long Pham
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to fully aligned via structures and methods of manufacture. The structure includes: a plurality of minimum ground rule conductive structures formed in a dielectric material each of which comprises a recessed conductive material therein; at least one conductive structure formed in the dielectric material which is wider than the plurality of minimum ground rule conductive structures; an etch stop layer over a surface of the dielectric layer with openings to expose the conductive material of the least one conductive structure and the recessed conductive material of a selected minimum ground rule conductive structure; and an upper conductive material fully aligned with and in direct electrical contact with the at least one conductive structure and the selected minimum ground rule conductive structure, through the openings of the etch stop layer.

18 Claims, 4 Drawing Sheets

(51) Int. Cl.
*H01L 23/532* (2006.01)
*H01L 21/3213* (2006.01)

(52) U.S. Cl.
CPC .. *H01L 23/53228* (2013.01); *H01L 23/53257* (2013.01); *H01L 21/32134* (2013.01); *H01L 21/32135* (2013.01)

(56) References Cited

U.S. PATENT DOCUMENTS

| | | | |
|---|---|---|---|
| 2009/0277867 A1* | 11/2009 | Mayer | B23H 5/08 216/13 |
| 2011/0034026 A1 | 2/2011 | Sunayama et al. | |
| 2016/0035675 A1* | 2/2016 | Hegde | H01L 23/53238 257/751 |
| 2016/0049364 A1 | 2/2016 | Edelstein et al. | |
| 2017/0256449 A1 | 9/2017 | Zhang et al. | |

FOREIGN PATENT DOCUMENTS

| | | |
|---|---|---|
| JP | 2015207779 | 11/2015 |
| JP | 2017037312 | 2/2017 |
| KR | 20170020854 | 2/2017 |

\* cited by examiner ial in minimum width features with alternative metal mater-

FULLY ALIGNED VIA IN GROUND RULE REGION

FIELD OF THE INVENTION

The present disclosure relates to semiconductor structures and, more particularly, to fully aligned via structures and methods of manufacture.

BACKGROUND

In advanced technology nodes, wiring structures are becoming ever smaller with minimum ground rules reaching feature sizes of 10 nm and less. In integrated circuits, the wiring structures on different wiring layers can be interconnected by fully aligned vias. The fully aligned vias provide the benefit of landing directly on the wiring structures having the minimum ground rule, as well as larger sized features.

In current fabrication processes, the fully aligned vias are formed in a same manner for accessing both the wiring structures having the minimum ground rule and the larger sized features. This results in a reduced volume of conductor material within the larger sized features, increasing its overall resistance.

SUMMARY

In an aspect of the disclosure, a structure comprises: a plurality of minimum ground rule conductive structures formed in a dielectric material each of which comprises a recessed conductive material therein; at least one conductive structure formed in the dielectric material which is wider than the plurality of minimum ground rule conductive structures; an etch stop layer over a surface of the dielectric layer with openings to expose the conductive material of the least one conductive structure and the recessed conductive material of a selected minimum ground rule conductive structure; and an upper conductive material fully aligned with and in direct electrical contact with the at least one conductive structure and the selected minimum ground rule conductive structure, through the openings of the etch stop layer.

In an aspect of the disclosure, a structure comprises: a plurality of minimum ground rule structures each of which comprises a recessed conductive material and having a minimum insulator spacing therebetween; at least one wiring structure having a larger dimension than the plurality of minimum ground rule structures; at least one wiring structure comprising a liner material and a conductive material which is different than the recessed conductive material; and an upper interconnect structure fully aligned with and in direct electrical contact with a selected minimum ground rule structure and at least one wiring structure.

In an aspect of the disclosure, a method comprises: depositing a first conductive material to fill trenches of minimum feature dimensions resulting in wire structures and another wire structure with a larger width than the minimum feature dimensions; recessing the first conductive material for the wire structures; forming fully aligned vias with a selected one of the wire structures and the other wire structure with the larger width; and depositing conductive material in the fully aligned vias to be in electrical contact with the recessed first conductive material and conductive material of the wire structure with the larger width.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
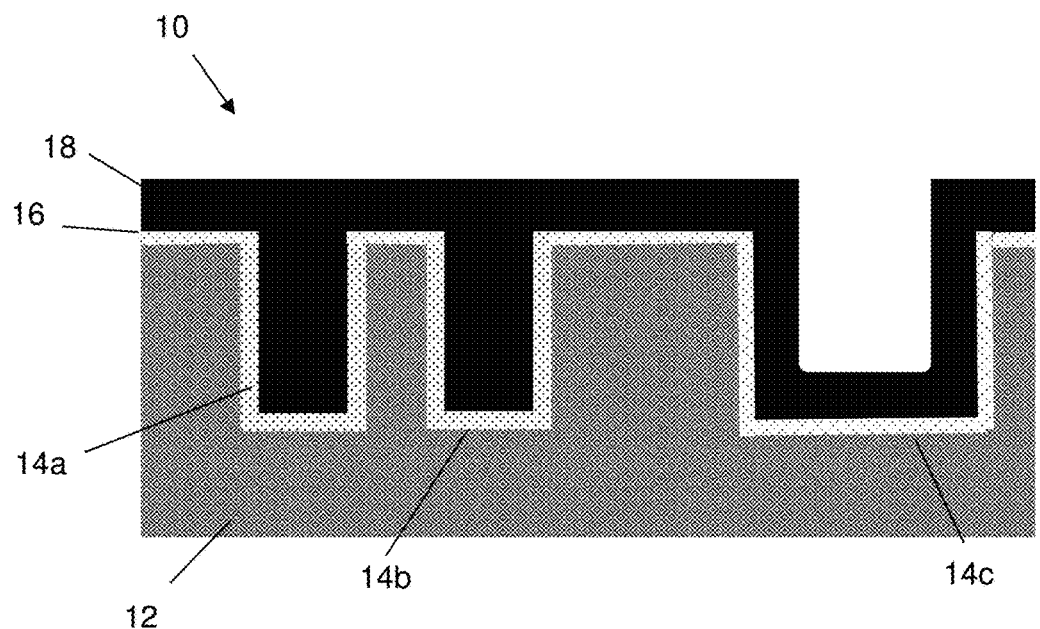
FIG. 1 shows a structure with minimum width features and wider features comprising an alternative metal material, amongst other features, and respective fabrication processes in accordance with aspects of the present disclosure.

The present disclosure relates to semiconductor structures and, more particularly, to fully aligned via structures and methods of manufacture. More specifically, the present disclosure provides independent control of minimum width lines (e.g., interconnects or other wiring structures) and wider lines for fully aligned via structures. By implementing the methods and structures described herein, it is now possible to enable dual metallization with fully aligned via (FAV) structures for improved via and interconnect resistance. Additional benefits include, e.g., improved wide line resistance over interconnects recessed on all lines and improved via resistance for selective wiring structures.

In embodiments, the method described herein includes depositing a layer of alternative metal material, e.g., Ru or Co, in interconnect structures, used for minimum width conductive lines or features (e.g., minimum width interconnect structures). The integration scheme further includes isotopically removing the alternative metal in wider features, e.g., wider conductive lines or features, while leaving the alternative metal material in minimum width features (minimum ground rule features). The wider features can then be filled with conductor material, e.g., Cu; whereas, the alternate metal material in the minimum width features is recessed, followed by a conductive material fill process for upper wiring layers to selected minimum width features. As the conductive material in the wider features is not recessed, a larger volume of material remains in the wider features to reduce its overall resistance (compared to conventional structures).

The conductive material fill process for the upper wiring layers will be in direct electrical contact with the recessed alternate metal material of selected minimum width features as well as the conductor material of the wider features. In alternative embodiments, the wider features can be filled with the alternative metal material, followed by the recessing and conductive material fill processes for forming upper wiring layers in contact with the selected minimum width features and the wider features.

The methods described herein result in structures with minimum width interconnects comprising alternative metal material, e.g., Ru or Co, and Cu wide interconnects. In this way, the resultant structure includes minimum width feature, e.g., interconnect structures, with dual conductor material on a same wafer with single material minimum width feature. In certain embodiments, wider interconnects can also include dual conductor material, e.g., copper and Ru. Additionally, the structures described herein can include alterative metal, e.g., Ru, which is recessed in the minimum area without recessing conductive material, e.g., Cu, in the wider line or feature. The resultant structures will have a 3D via/line interface which enables increased contact area.

The fully aligned via structures of the present disclosure can be manufactured in a number of ways using a number of different tools. In general, though, the methodologies and tools are used to form structures with dimensions in the micrometer and nanometer scale. The methodologies, i.e., technologies, employed to manufacture the fully aligned via structures of the present disclosure have been adopted from integrated circuit (IC) technology. For example, the structures are built on wafers and are realized in films of material patterned by photolithographic processes on the top of a wafer. In particular, the fabrication of the fully aligned via structures uses three basic building blocks: (i) deposition of thin films of material on a substrate, (ii) applying a patterned mask on top of the films by photolithographic imaging, and (iii) etching the films selectively to the mask.

FIG. 1 shows a structure with minimum width features and wider features, amongst other features, and respective fabrication processes in accordance with aspects of the present disclosure. More specifically, the structure 10 of FIG. 1 includes a substrate 12, e.g., interlevel dielectric material, having a plurality of trenches 14a, 14b, 14c. In embodiments, the trenches 14a, 14b will be used to form minimum width features, e.g., minimum ground rule interconnect structures or wire structures; whereas, the trenches 14c will be used to form a wider width feature. The interlevel dielectric material 12 can be an oxide based material, for example $SiO_2$ or SiCOH.

The plurality of wires 14a, 14b, 14c can be formed by conventional lithography and etching processes. For example, a resist formed over the interlevel dielectric material 12 is exposed to energy (light) to form a pattern (opening). An etching process with a selective chemistry, e.g., reactive ion etching (RIE), will be used to form one or more trenches 14a, 14b, 14c in the substrate 12 through the openings of the resist. In embodiments, the plurality of trenches 14a, 14b can have a width of about 12 nm to 24 nm and a pitch of about 40 nm or below; although other dimensions are contemplated herein depending on the particular technology node.

Still referring to FIG. 1, following resist removal, a liner 16 is formed over the exposed surfaces of the interlevel dielectric material 12 including within the wire structures 14a, 14b, 14c. The liner 16 can be a TiN, Ta, TaN, Co or Ru liner deposited by a conventional deposition process, e.g., chemical vapor deposition (CVD). An alternative metal material 18, e.g., Ru or Co, is deposited over the liner 16. The alternative metal material 18 (also referred to as a primary metal material) can be deposited by a conventional CVD process to fill the wire structures 14a, 14b. In more specific embodiments, the alternative metal material 18 is deposited to a thickness of about 7 nm to 12 nm to ensure complete fill of the wire structures 14a, 14b; although other thicknesses are also contemplated, depending on the particular technology node, e.g., dimensions of the wire structures 14a, 14b. An anneal process is performed on the alternative metal material 18.

Figure 2:
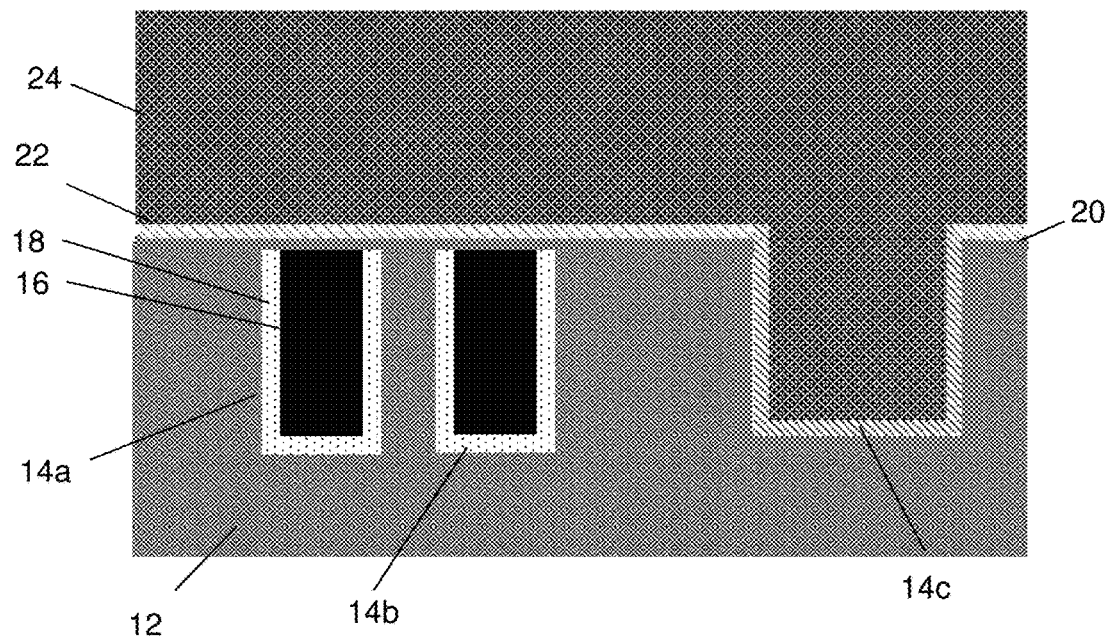
FIG. 2 shows the minimum width features with the alternative metal material and the wider features with conductive material fill, amongst other features, and respective fabrication processes in accordance with aspects of the present disclosure.

As shown in FIG. 2, the alternative metal material 18 is removed from the wire structure 14c and the upper surfaces of the substrate 12. The alternative metal material 18 can be removed by a conventional isotropic etching process, e.g., reactive ion etching (RIE), followed by a wet clean process. As should be understood by those of skill in the art, the isotropic etching process can be a timed etching process that will remove all of the material from the upper surface of the interlevel dielectric material 12 and within the wire structure 14c, while leaving the alternative metal material 18 in the wire structure 14a, 14b. The conventional isotropic etching process can be a dry process or a wet process.

Following the isotropic etching process, a metallization process is performed to fill the wire structure 14c. In particular, a barrier layer 20 can be deposited on the surfaces of the substrate 12 and within the wire structure 14c. The barrier layer 20 can be a TiN, Ta or TaN material deposited by conventional CVD process, plasma enhanced CVD (PE-VCD) process or atomic layer deposition (ALD) process, as examples. The barrier layer 20 can be deposited to a thickness of about 4 nm or less. A liner 22 is deposited on the barrier layer 20 to a thickness of about 4 nm or less. In embodiments, the liner 22 can be a TiN material, TaN material, Co, Ru or other known liner material. A metallization (conductor material) is deposited (e.g., by conventional deposition processes (e.g., CVD)) over the liner 22, completely filling the wire structure 14c. In embodiments, the metallization can be a copper material fill process; although other metal or metal alloys are contemplated herein. In this way, a wide feature, e.g., wide interconnect structure, and minimum width features can be formed in the wire structures 14a, 14b, 14c. Hereinafter, the minimum width features and the wide feature and will be interchangeably referred as reference numerals 14a, 14b and 14c, respectively.

Figure 3:
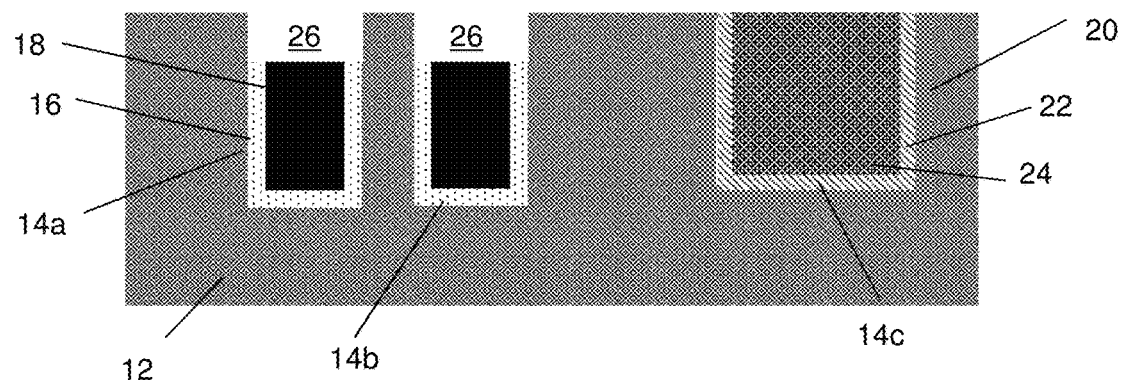
FIG. 3 shows alternative metal material recessed within the minimum width features, amongst other features, and respective fabrication processes in accordance with aspects of the present disclosure.

In FIG. 3, any conductor material 24 on the surfaces of the substrate 12 can be removed by a conventional chemical mechanical polishing (CMP) process. Accordingly, the conductor material 24 will be planar with the surface of the interlevel dielectric material 12, e.g., is planar with the dielectric material 12 on a same level as the plurality of minimum ground rule structures (wire structures 14a, 14b). Following the CMP process, the alternative metal material 18 and liner 16 in the wire structures 14a, 14b can be recessed, as shown representatively by reference numeral 26. On the other hand, the conductor material 24 in the wire structure 14c remains planar with the interlevel dielectric layer 12 (on a same level as the plurality of minimum ground rule structures, leaving wide lines with full volume conductor. This will provide improved resistance characteristics compared to conventional structures which include recessed portions.

In embodiments, the recess 26 can be about 5 nm to about 12 nm; although others dimensions are contemplated herein with the understanding that such recess should maintain a minimum insulation spacing between the minimum width features 14a, 14b. This minimum insulation spacing will ensure that the minimum width features, e.g., interconnects, will not short together, hence maintaining the reliability of the integrated circuit. The recess 26 can be fabricated by a RIE process or wet chemical etch process with a selective chemistry. By using a selective chemistry, it is not necessary to use a masking process to form the recess 26.

Figure 4:
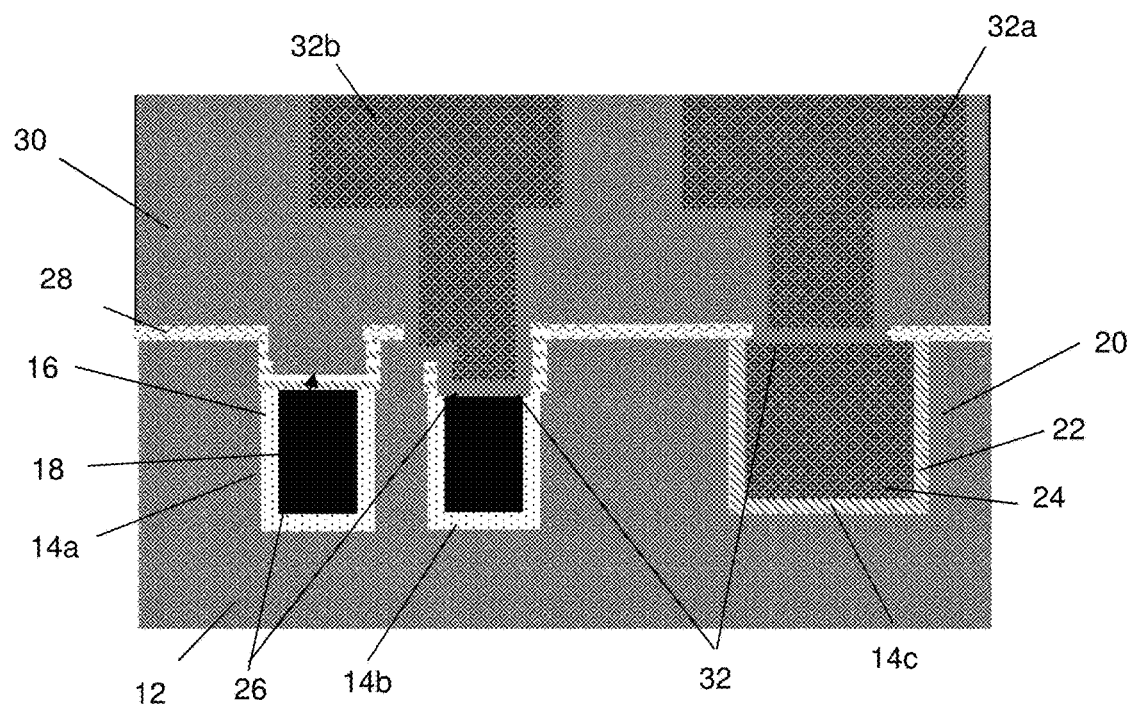
FIG. 4 shows fully aligned via structures in electric contact with selected minimum width features and the wider feature, amongst other features, and respective fabrication processes in accordance with aspects of the present disclosure.
Figure 5:
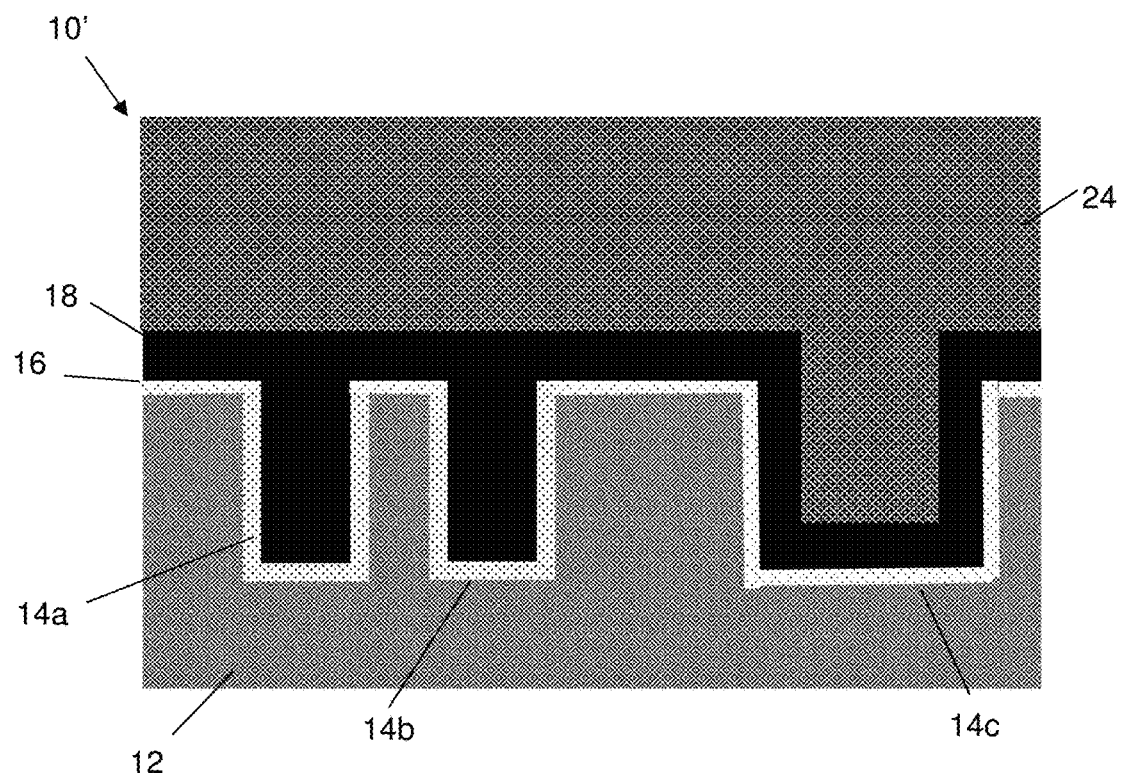
FIGS. 5-8 show structures with minimum width features and wider features, amongst other features, and respective fabrication processes in accordance with additional aspects of the present disclosure.

As further shown in FIG. 4, fully aligned interconnect structures 32a, 32b are formed in an upper interlevel dielectric material 30. The fully aligned interconnect structures 32a, 32b are in direct electrical contact with the minimum width feature 14b and the wider feature (e.g., wire structure) 14c. To form the fully aligned interconnect structures 32a, 32b, e.g., dual damascene structures, a cap material 28, e.g., nitride material, is deposited in the recesses 26 of the minimum width features (e.g., wire structures) 14a, 14b, over the metallization 24 of the wide feature 14c and on any exposed surfaces of the interlevel dielectric material 12.

The interlevel dielectric material 30 is deposited using a conventional CVD process, as an example, followed by a dual damascene process to form vias and trenches within the interlevel dielectric material 30. It should also be understood by those of skill in the art that the single damascene processes can also be performed to form the vias and the trenches. The damascene process will be fully aligned with the selected minimum width feature 14b such that the metallization 24 of the wide feature 14c and the alternative metal material 18 of a selected minimum width feature 14b will be exposed for subsequent metallization processes. The damascene structures, e.g., via and trench, are filled with a metallization material 32 comprising a liner and copper material, for example. The metallization material 32 can alternatively include other conductive material such as, e.g., aluminum, Ru, Co, etc.

Advantageously, as a minimum width is maintained between the minimum width features 14a, 14b, the interconnect structure 32b will fully land on the selected minimum width feature 14b, while not shorting to the minimum width feature 14a. In addition, by implementing the processes described herein, the fully aligned interconnect structures 32a, 32b can occur in any ground rule area and, more particularly, in electrical contact with the selected minimum width feature 14b. This will provide a more controllable process while improving line resistance in wide line structures, e.g., wire structure 14c.

FIGS. 5-8 show structures with minimum width features and wider features, amongst other features, and respective fabrication processes in accordance with additional aspects of the present disclosure. More specifically, referring to FIG. 5, the structure 10' includes a substrate 12, e.g., interlevel dielectric material of oxide material, with a plurality of wire structures 14a, 14b, 14c. As in the previous embodiments, the wire structures 14a, 14b will form minimum width features, e.g., interconnect structures; whereas, the wire structure 14c will form a wider width interconnect feature.

A liner 16, e.g., Ta, TaN, or TiN, is formed over the exposed surfaces of the interlevel dielectric material 12 including within the wire structures 14a, 14b, 14c. An alternative metal material 18 is deposited over the liner 16. In embodiments, the alternative metal material is Ru or Co, as preferred examples, deposited by a conventional CVD process to fill the vias 14a, 14b and line the wire structure 14c. In more specific embodiments, the alternative metal material 18 is deposited to a thickness of about 7 nm to 12 nm to ensure complete fill of the wire structures 14a, 14b; although other dimensions are contemplated depending on the technology node. An anneal process is performed following the deposition of the alternative metal material 18. A metallization process, e.g., copper fill process, is performed to fill the via 14c with conductor material 24, with the alternative metal material 18 now acting as a liner in the wire structure 14c. In embodiments, the metallization process can be a deposition of a seed layer and a copper plating process.

Figure 6:
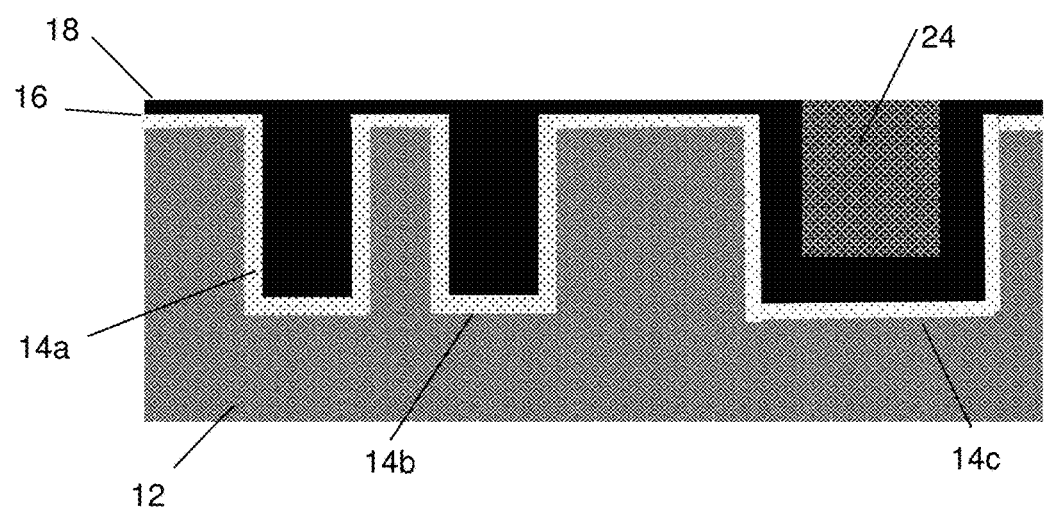

As shown in FIG. 6, any conductor material 24 on the surfaces of the interlevel dielectric material 12 can be removed by a conventional CMP process. In embodiments, the CMP process can also remove a portion of the alternative metal material 18. In alternative embodiments, the CMP process can completely remove the conductor material 24 on the surface of interlevel dielectric material 12, in addition to the alternative metal material 18 and the liner 16 on the surfaces of the interlevel dielectric material 12, e.g., outside of the wire structures 14a, 14b, 14c. In either approach, the conductor material 24 in the wire structure 14c will remain approximately planar (not intentionally recessed) with the surface of the interlevel dielectric material 12. This will provide improved resistance characteristics compared to conventional structures.

Figure 7:
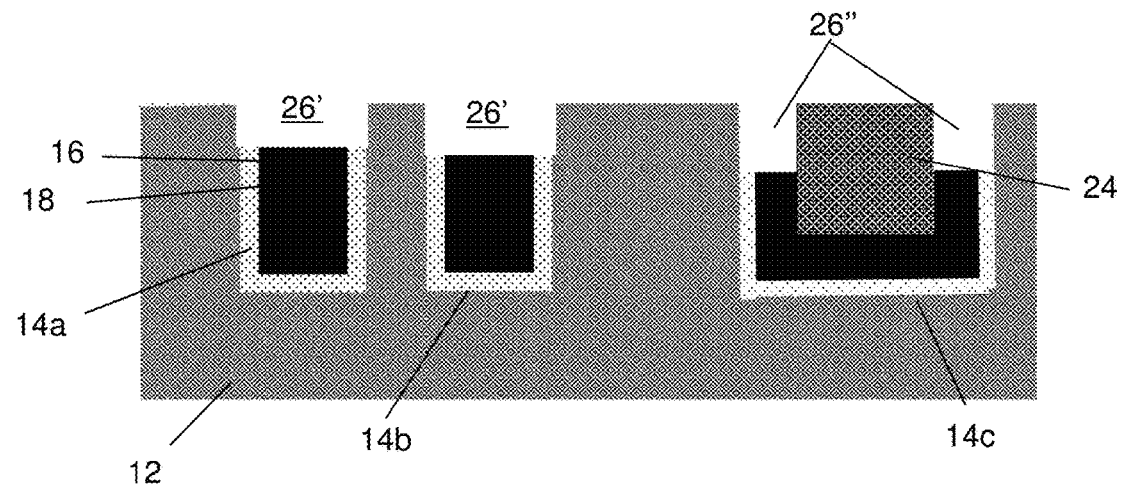

In FIG. 7, the alternative metal material 18 in the wire structures 14a, 14b, 14c can be recessed, as shown representatively by reference numerals 26', 26". As in the previous embodiment, the depth of the recesses 26', 26" can vary depending on the technology node, e.g., the pitch spacing between the vias 14a, 14b to ensure minimum insulation spacing between the minimum width features 14a, 14b. For example, the depth of the recesses 26', 26" be about 5 nm to about 12 nm. The recesses 26', 26" can be fabricated by a RIE process or wet chemical etch process with a selective chemistry, thereby avoiding the costs associated with using a separate masking process. The conductor material 24 in the wire structure 14c remains planar with the interlevel dielectric layer 12.

Figure 8:
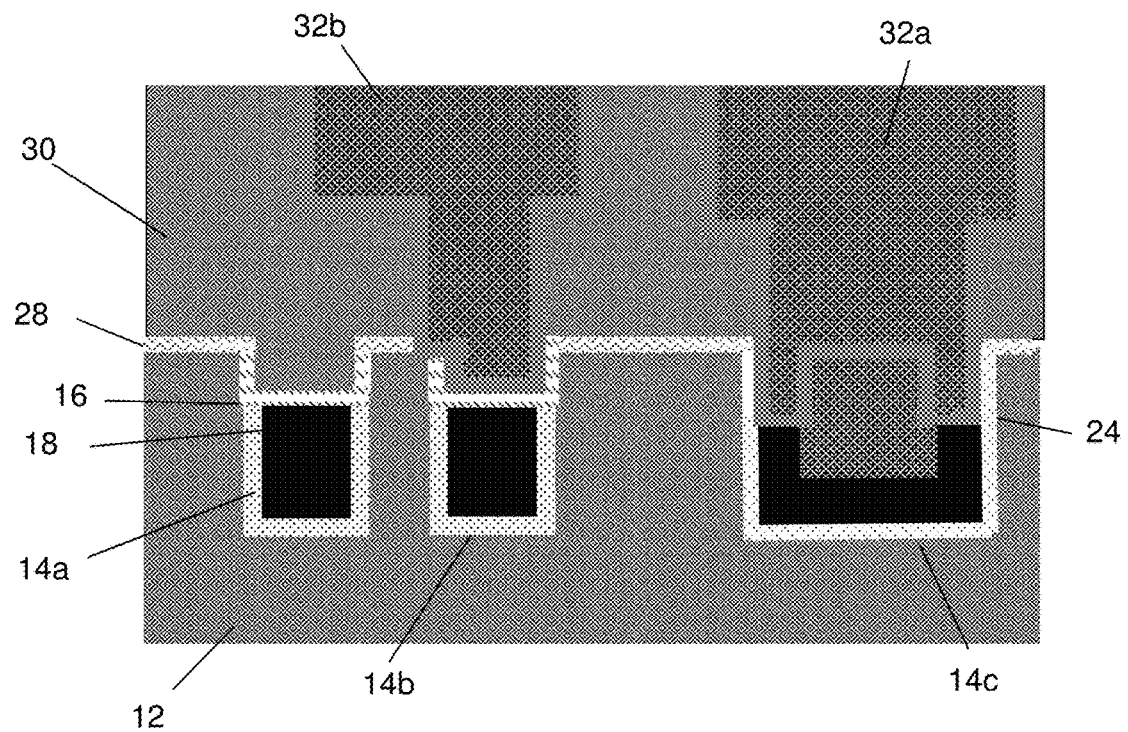

As shown in FIG. 8, the fully aligned interconnect structures 32a, 32b are formed in the interlevel dielectric material 30 in direct electrical contact with the minimum width feature 14b and the wider feature 14c. The fully aligned interconnect structures 32a, 32b are formed by depositing a cap material 28, e.g., nitride material, in the recesses 26', 26" and over any exposed surfaces of the substrate 12, followed by deposition of the interlevel dielectric material 30 and a dual damascene or multiple single damascene processes to form vias and trenches within the interlevel dielectric material 30. The damascene processes will expose the metallization of the wide feature 14c and the alternative metal material 18 of the wide feature 14c and a selected minimum width feature 14b, resulting in a fully aligned via with the selected minimum width feature 14b. The damascene structures, e.g., vias and trenches, are filled with a metallization material 32 comprising a liner and conductive materials, e.g., Cu, Al, Ru, Co, etc. This process with thus enable a combined Ru (or Co) metallization and fully aligned via for smaller node technologies.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a plurality of minimum ground rule conductive structures formed in a dielectric material each of which comprises a recessed conductive material therein;
at least one conductive structure formed in the dielectric material which is wider than the plurality of minimum ground rule conductive structures;
an etch stop layer over a surface of the dielectric layer with openings to expose the conductive material of the least one conductive structure and the recessed conductive material of a selected minimum ground rule conductive structure; and
an upper conductive material fully aligned with and in direct electrical contact with the at least one conductive structure and the selected minimum ground rule conductive structure, through the openings of the etch stop layer,
wherein the etch stop layer is directly on the recessed conductive material of another selected minimum ground rule conductive structure and the opening exposes the recessed conductive material of the selected minimum ground rule conductive structure and partly exposes an upper surface of the conductive material of the least one conductive structure.

2. The structure of claim 1, wherein the recessed conductive material is Ru.

3. The structure of claim 1, wherein the recessed conductive material is Co.

4. The structure of claim 1, wherein conductive material of at least one conductive structure is planar with the dielectric material.

5. The structure of claim 4, wherein a recessed liner is under the conductive material.

6. The structure of claim 5, wherein the recessed liner is a same material as the recessed conductive material.

7. The structure of claim 6, wherein the upper conductive material is in electrical contact with the recessed liner and the conductive material.

8. The structure of claim 7, wherein the conductive material of the at least one conductive structure is planar with the dielectric material.

9. A structure comprising:
a plurality of minimum ground rule structures each of which comprises a recessed conductive material and having a minimum insulator spacing therebetween;
at least one wiring structure having a larger dimension than the plurality of minimum ground rule structures, the at least one wiring structure comprising a liner material and a conductive material which is different than the recessed conductive material; and
an upper interconnect structure fully aligned with and in direct electrical contact with a selected minimum ground rule structure and the at least one wiring structure.

10. The structure of claim 9, wherein the recessed conductive material is Ru.

11. The structure of claim 9, wherein the recessed conductive material is Co.

12. The structure of claim 9, wherein conductive material of the at least one wiring structure is planar with a dielectric material which is for a same wiring level as the plurality of minimum ground rule structures.

13. The structure of claim 9, wherein a recessed liner is under a primary conductive material of the at least one wiring structure.

14. The structure of claim 13, wherein the recessed liner is a same material as the recessed conductive material.

15. The structure of claim 14, wherein the upper interconnect structure is in electrical contact with the recessed liner and surrounds the conductive material.

16. The structure of claim 14, wherein the primary conductive material is planar with a dielectric material of a same wiring layer of the plurality of minimum ground rule structures.

17. The structure of claim 1, further comprising a single liner under and in direct contact with the recessed conductive material of the plurality of the minimum ground rule conductive structures, and a barrier layer and a liner are directly under the conductive material of the least one conductive structure.

18. The structure of claim 9, further comprising:
an etch stop layer with openings to expose an upper surface of a first of the recessed conductive material having the minimum insulator spacing, and covering a second of the recessed conductive material having the minimum insulator spacing;
the at least one wiring structure further comprising a second conductor material over the conductive material, with the conductive material being recessed; and
the upper interconnect structure is in directed electrical contact the recessed conductive material and the second conductive material.

* * * * *